(12) United States Patent
Lee et al.

(10) Patent No.: US 12,136,759 B2
(45) Date of Patent: Nov. 5, 2024

(54) ANTENNA-IN-PACKAGE DEVICES AND METHODS OF MAKING

(71) Applicant: STATS ChipPAC Pte. Ltd., Singapore (SG)

(72) Inventors: HunTeak Lee, Gyeonggi-do (KR); KyoungHee Park, Seoul (KR); KyungHwan Kim, Seoul (KR); SeungHyun Lee, Incheon (KR); SangJun Park, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 133 days.

(21) Appl. No.: 17/452,855

(22) Filed: Oct. 29, 2021

(65) Prior Publication Data

US 2023/0140748 A1    May 4, 2023

(51) Int. Cl.
| | |
|---|---|
| H05K 1/18 | (2006.01) |
| H01L 21/56 | (2006.01) |
| H01L 23/31 | (2006.01) |
| H01L 23/36 | (2006.01) |
| H01L 23/552 | (2006.01) |
| H01Q 1/22 | (2006.01) |
| H05K 3/34 | (2006.01) |
| H01L 23/498 | (2006.01) |
| H01L 25/16 | (2023.01) |
| H01R 12/71 | (2011.01) |

(52) U.S. Cl.
CPC .......... *H01Q 1/2283* (2013.01); *H01L 21/56* (2013.01); *H01L 23/3121* (2013.01); *H01L 23/36* (2013.01); *H01L 23/552* (2013.01); *H05K 1/181* (2013.01); *H05K 3/3436* (2013.01); *H01L 23/49816* (2013.01); *H01L 25/16* (2013.01); *H01R 12/716* (2013.01); *H05K 2201/10098* (2013.01); *H05K 2201/10189* (2013.01)

(58) Field of Classification Search
CPC ............ H05K 1/02; H05K 1/14; H05K 1/141; H05K 1/18; H05K 1/181–187; H01L 23/552; H01L 23/556; H01L 23/66; H01L 23/3107; H01Q 1/38; H01Q 1/2283; H01Q 1/22
USPC ........................ 361/782–790, 795, 816, 818; 257/659–690, 787–790; 174/520
See application file for complete search history.

(56) References Cited

U.S. PATENT DOCUMENTS

| | | | | |
|---|---|---|---|---|
| 6,083,768 | A * | 7/2000 | Jiang ....................... | H01L 21/56 438/26 |
| 6,414,248 | B1 * | 7/2002 | Sundstrom ........... | H05K 3/3436 174/262 |
| 9,859,232 | B1 * | 1/2018 | Chiang ............... | H01L 23/3121 |
| 10,163,773 | B1 * | 12/2018 | Kapusta .................. | H01L 24/17 |
| 10,566,298 | B2 | 2/2020 | Dalmia et al. | |

(Continued)

*Primary Examiner* — Tuan T Dinh
(74) *Attorney, Agent, or Firm* — Brian M. Kaufman; Robert D. Atkins; PATENT LAW GROUP: Atkins and Associates, P.C.

(57) ABSTRACT

A semiconductor device has a PCB with an antenna and a semiconductor package mounted onto the PCB. An epoxy molding compound bump is formed or disposed over the PCB opposite the semiconductor package. A first shielding layer is formed over the PCB. A second shielding layer is formed over the semiconductor package. A board-to-board (B2B) connector is disposed on the PCB or as part of the semiconductor package. A conductive bump is disposed between the semiconductor package and PCB.

23 Claims, 12 Drawing Sheets

(56) References Cited

U.S. PATENT DOCUMENTS

| | | | |
|---|---|---|---|
| 10,672,727 B2* | 6/2020 | Kim | H01L 23/552 |
| 10,685,924 B2* | 6/2020 | Lasiter | H01L 21/6835 |
| 11,510,311 B2* | 11/2022 | Yamamoto | H05K 1/181 |
| 11,756,894 B2* | 9/2023 | Han | H01Q 1/526 |
| | | | 257/428 |
| 2012/0228749 A1* | 9/2012 | Pagaila | H01L 21/56 |
| | | | 257/659 |
| 2012/0292745 A1* | 11/2012 | Park | H01L 23/3128 |
| | | | 257/E21.705 |
| 2012/0320542 A1* | 12/2012 | Jeong | H05K 3/323 |
| | | | 156/60 |
| 2013/0343022 A1* | 12/2013 | Hu | H01L 24/19 |
| | | | 29/829 |
| 2014/0293529 A1* | 10/2014 | Nair | H01Q 7/06 |
| | | | 257/690 |
| 2015/0380813 A1* | 12/2015 | Aoki | H01L 24/32 |
| | | | 438/126 |
| 2018/0034132 A1* | 2/2018 | Takahashi | H01Q 1/242 |
| 2019/0051989 A1 | 2/2019 | Kim et al. | |
| 2019/0181126 A1* | 6/2019 | Cheah | H01L 23/552 |
| 2019/0280368 A1* | 9/2019 | Khan | H01Q 1/2283 |
| 2019/0348747 A1* | 11/2019 | Liu | H01L 24/20 |
| 2020/0161252 A1* | 5/2020 | Yang | H01L 21/568 |
| 2020/0211977 A1* | 7/2020 | Kim | H01L 21/6835 |
| 2020/0253040 A1* | 8/2020 | Dalmia | H01L 23/49838 |
| 2021/0036413 A1* | 2/2021 | Kim | H01L 23/5385 |
| 2021/0091017 A1 | 3/2021 | Yeon et al. | |
| 2021/0175152 A1* | 6/2021 | Zhang | H01L 21/56 |
| 2021/0184335 A1* | 6/2021 | Wang | H01L 24/20 |
| 2021/0280959 A1* | 9/2021 | Han | H05K 1/185 |
| 2021/0296773 A1* | 9/2021 | Baniya | H05K 1/0243 |

* cited by examiner

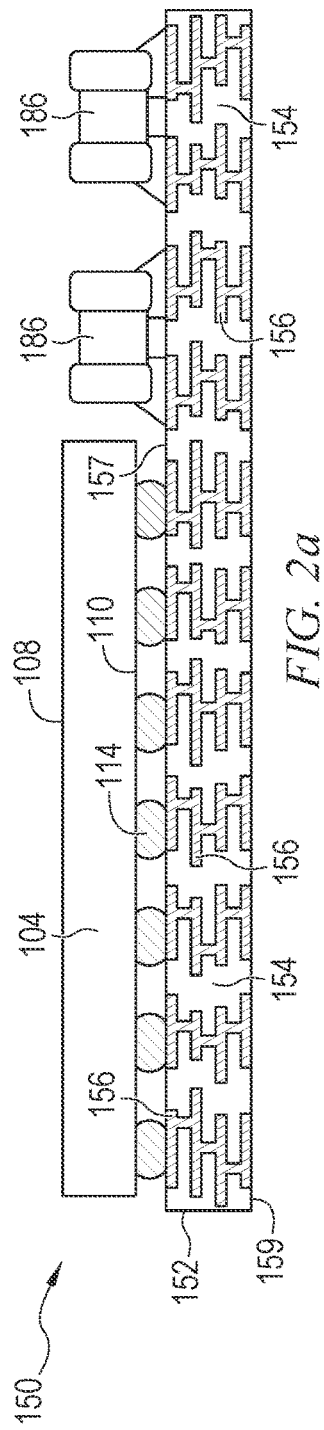
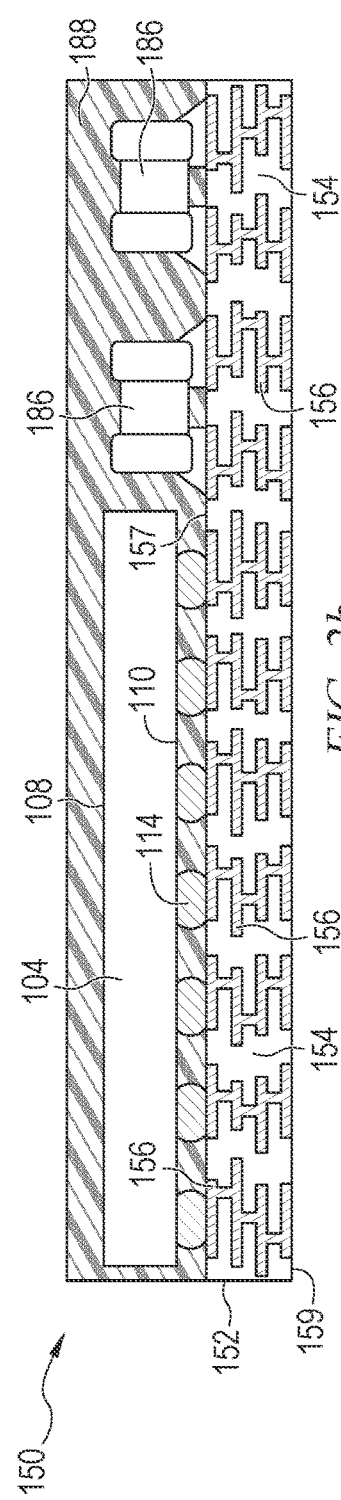
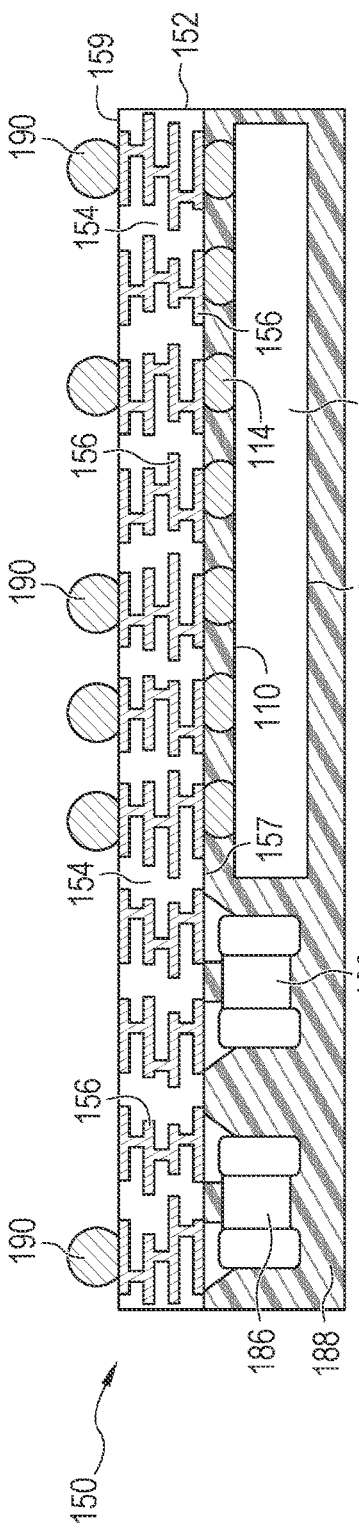
FIG. 2a
FIG. 2b
FIG. 2c

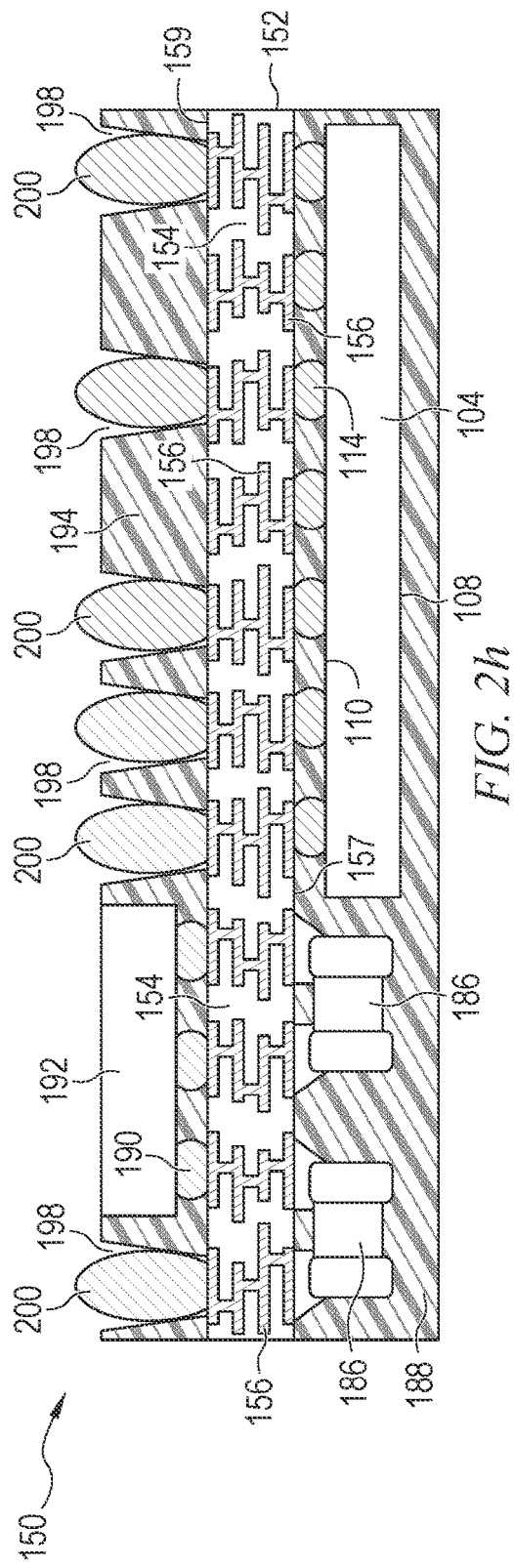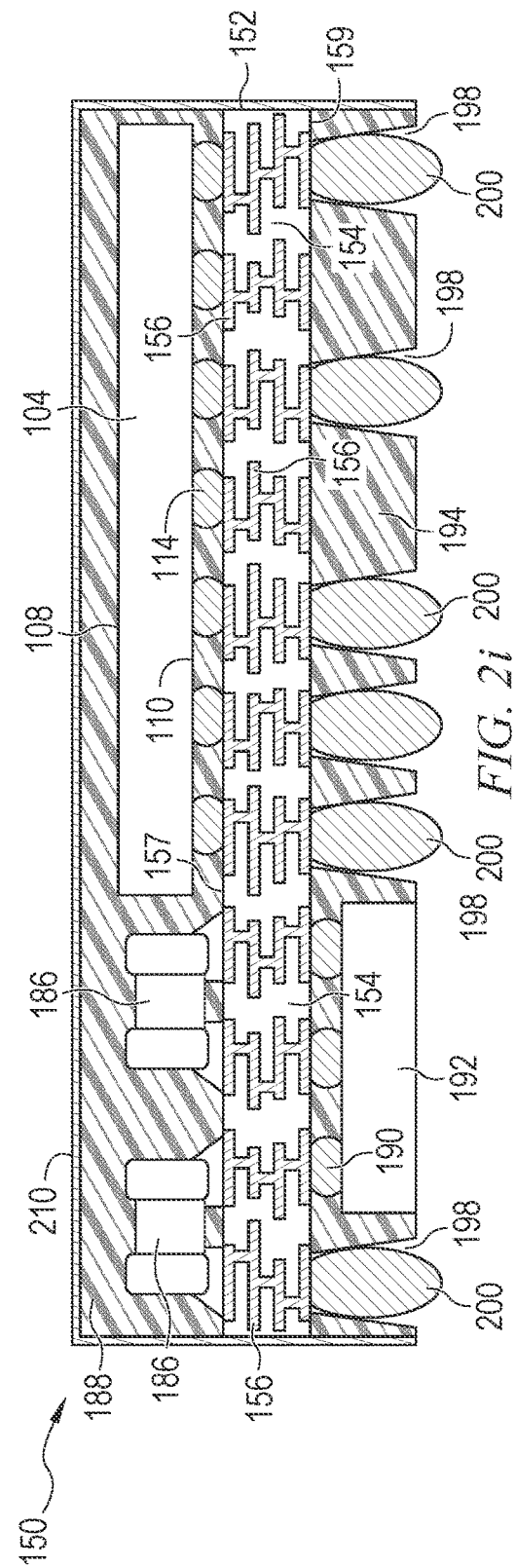

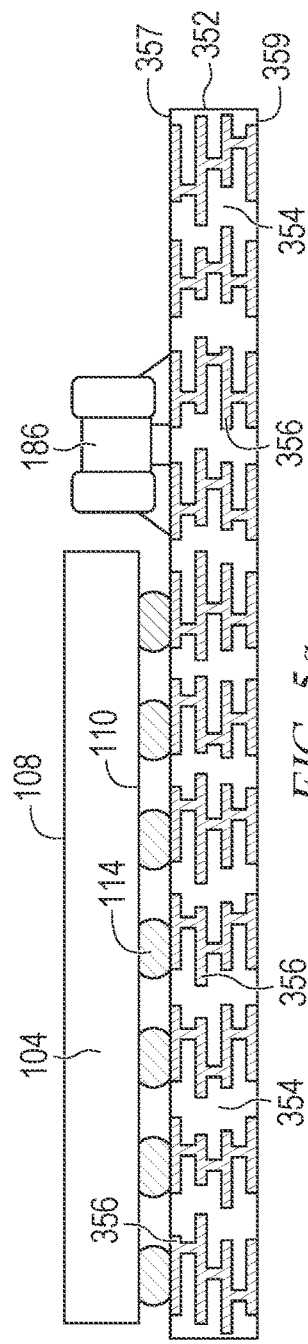
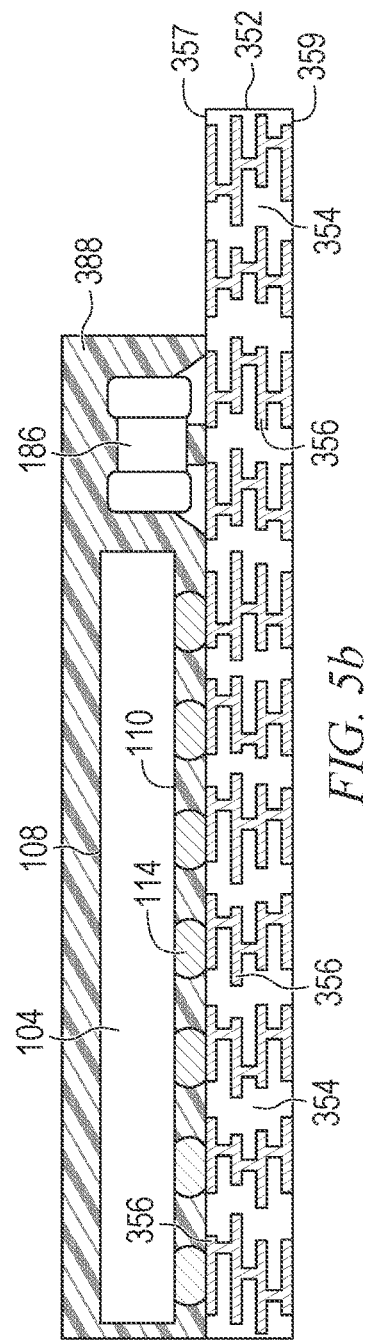
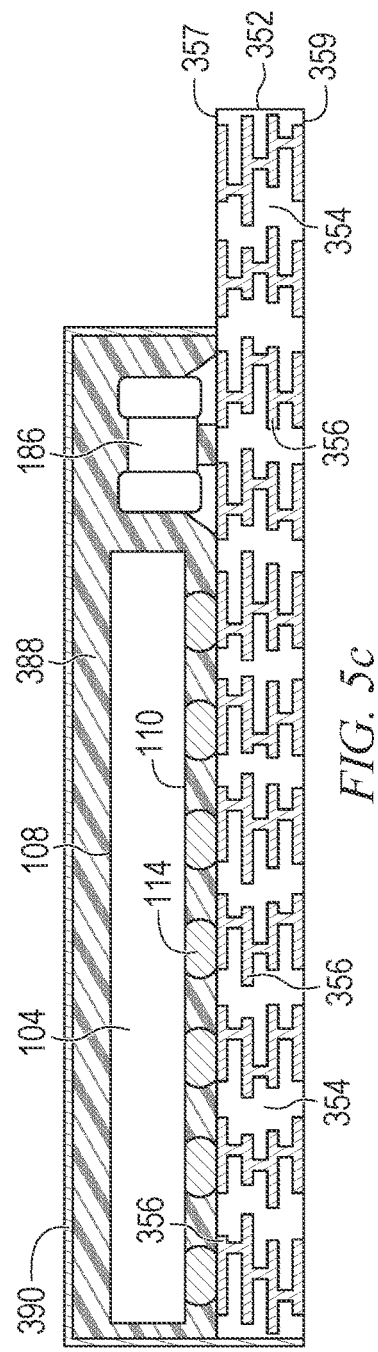

ANTENNA-IN-PACKAGE DEVICES AND METHODS OF MAKING

FIELD OF THE INVENTION

The present invention relates in general to semiconductor devices and, more particularly, to an antenna-in-package device and method of making the same.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components.

Back-end processes may result in semiconductor device packages with a smaller footprint by improvements in electrical interconnection and packaging materials.

In recent years, antenna-in-package (AiP) devices, having semiconductor systems and antennae integrated into one package, have been adopted for mobile handsets and other portable multimedia devices. However, AiP packages currently manufactured are not sufficient to meet the reduced interface pitches, higher interface pin counts, reduced thickness, tight warpage control, and higher level of integration required by cutting-edge cellular technologies and a general desire for reduced device sizes. Therefore, a need exists for improved AiP devices and methods of making the same.

BRIEF DESCRIPTION OF THE DRAWINGS

FIGS. 2a-2i illustrate forming a SiP module for use in an AiP device;

FIGS. 5a-5e illustrate a second SiP module embodiment;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental protection. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contacts within the package. The electrical connections can be made with conductive layers, bumps, stud bumps, conductive paste, bond wires, or other suitable interconnect structure. An encapsulant or other molding material is deposited over the package to provide physical support and electrical isolation. The finished package is then inserted into an electrical system and the functionality of the semiconductor device is made available to the other system components.

Figure 1A:
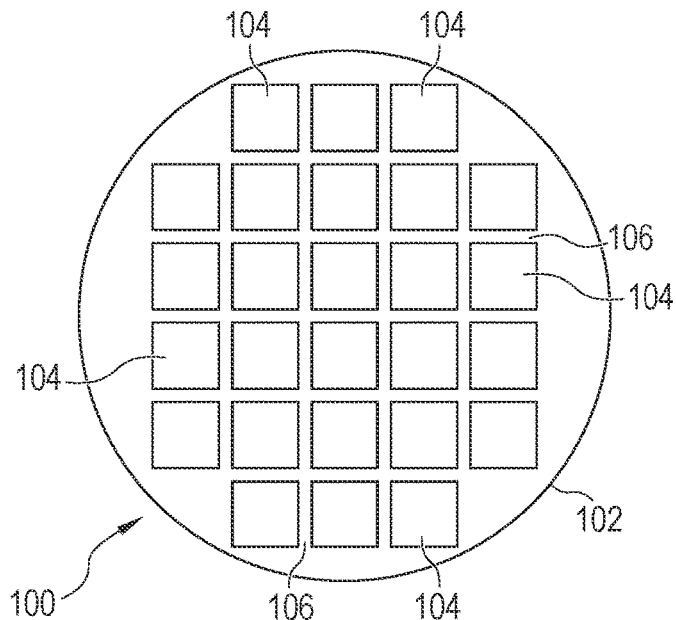
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
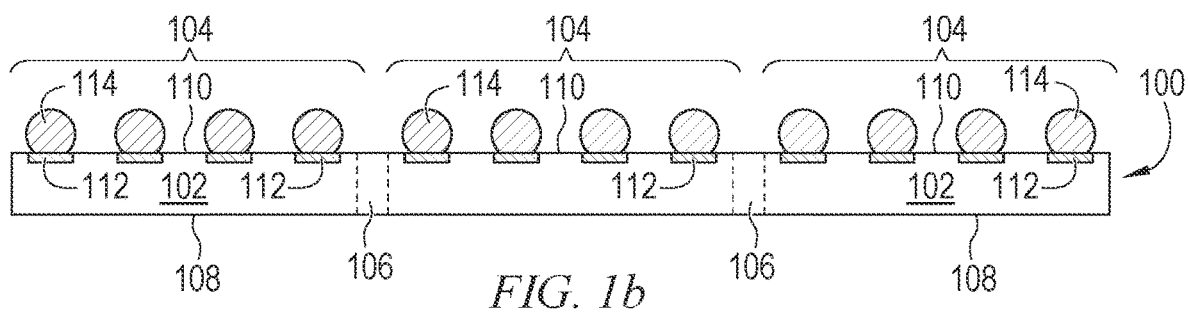

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), power amplifier, application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, combinations thereof, or other suitable conductive materials with an optional flux solution. For example, the bump material can be eutectic Sn/Pb, high-lead solder, or lead-free solder. The bump material is bonded to conductive layer 112 using a suitable attachment or bonding process. For example, the bump material can be reflowed by heating the material above its melting point to form balls or bumps 114. In one embodiment, bump 114 is formed over an under-bump metallization (UBM) having a wetting layer, barrier layer, and adhesion layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
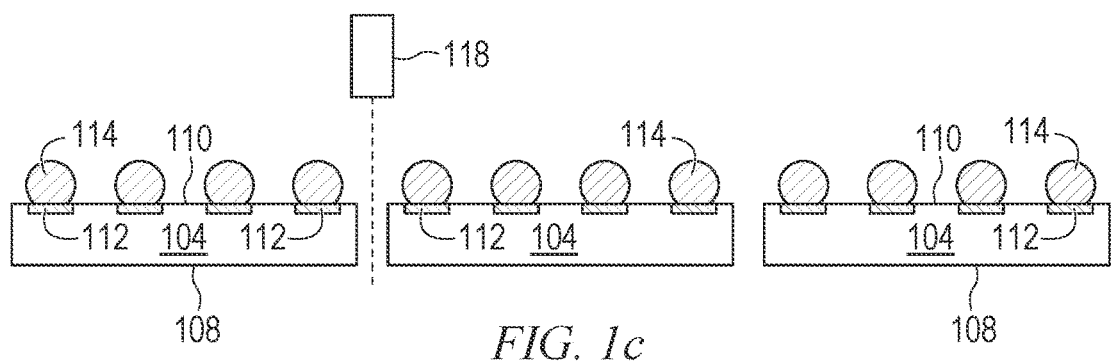

In FIG. 1c, semiconductor wafer 100 is singulated through saw street 106 using a saw blade or laser cutting tool 118 into individual semiconductor die 104. The individual semiconductor die 104 can be inspected and electrically tested for identification of known-good die (KGD) post singulation.

Figure 2D:
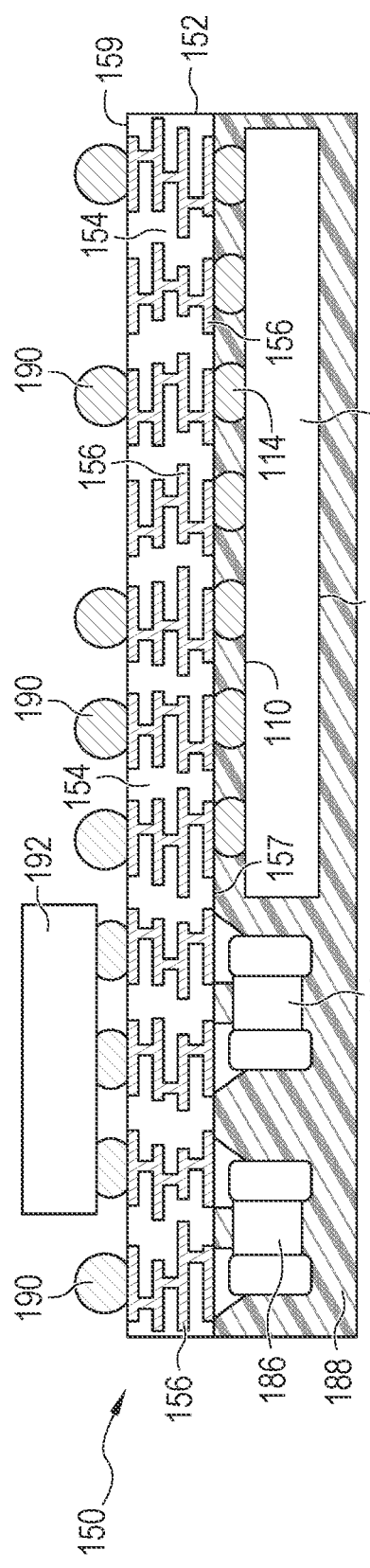

FIGS. 2a-2i illustrate forming an SiP module 150 with semiconductor die 104. FIG. 2a is a partial cross-sectional view of a substrate 152 used as a base for manufacturing SiP modules 150. Substrate 152 can be a unit substrate singulated from a larger panel or remain as part of a larger substrate panel until later in the manufacturing process. Hundreds or thousands of packages are commonly formed in a single substrate panel, or on a common carrier with already-singulated unit substrates, using the same steps described herein for a single unit but performed en masse.

Substrate 152 includes one or more insulating layers 154 interleaved with one or more conductive layers 156. Insulating layer 154 is a core insulating board in one embodiment, with conductive layers 156 patterned over the top and bottom surfaces, e.g., a copper-clad laminate substrate. Conductive layers 156 also include conductive vias electrically coupled through insulating layers 154. Substrate 152 can include any number of conductive and insulating layers interleaved over each other. A solder mask or passivation layer can be formed over either side of substrate 152. Any suitable type of substrate or leadframe is used for substrate 152 in other embodiments.

Any components desired to implement the intended functionality of SiP modules 150 are mounted to or disposed over substrate 152 and electrically connected to conductive layers 156. Substrate 152 has two major surfaces: top surface 157 and bottom surface 159. Electrical components can be mounted onto top surface 157 and bottom surface 159 in any suitable configuration. FIG. 2a shows semiconductor die 104 and discrete components 186 mounted onto top surface 157 as merely one example.

Manufacturing of SiP module 150 on substrate 152 commences with surface mounting of semiconductor die 104 and discrete component 186 on top surface 157. Semiconductor die 104 can be picked and placed onto substrate 152 with bumps 114 on contact pads of conductive layer 156. Discrete components 186, e.g., resistors, capacitors, inductors, transistors, or diodes, are mounted using solder paste or another suitable attachment and connection mechanism. The solder paste is reflowed between terminals of discrete components 186 and contact pads of conductive layers 156 on top surface 157 at the same time as bumps 114 are reflowed to attach semiconductor die 104. In some embodiments, an adhesive or underfill layer is used between semiconductor die 104 and substrate 152.

In FIG. 2b, an encapsulant or molding compound 188 is deposited over substrate 152, semiconductor die 104, and discrete components 186 using a paste printing, compressive molding, transfer molding, liquid encapsulant molding, vacuum lamination, spin coating, or other suitable applicator. Encapsulant 188 can be polymer composite material, such as an epoxy resin, epoxy acrylate, or polymer with or without a filler. Encapsulant 188 is non-conductive and environmentally protects the semiconductor device from external elements and contaminants. Encapsulant 188 also protects semiconductor die 104 from degradation due to exposure to light.

In FIG. 2c, substrate 150 is flipped or otherwise oriented so that bottom surface 159 is accessible. Conductive bumps 190 are formed or disposed on contact pads of conductive layer 156 in a similar manner to conductive bumps 114 on conductive layer 112. FIG. 2d shows an auxiliary semiconductor die 192 disposed on bottom surface 159. Semiconductor die 192 is structurally similar to semiconductor die 104, but may have different size and functionality. In one embodiment, for example, semiconductor die 104 is a microprocessor or microcontroller integrated circuit (IC) and semiconductor die 192 is a fifth-generation (5G) transceiver IC that semiconductor die 104 uses to transmit and receive a cellular signal. Semiconductor die 104 and 192 can serve any suitable purpose.

Figure 2E:
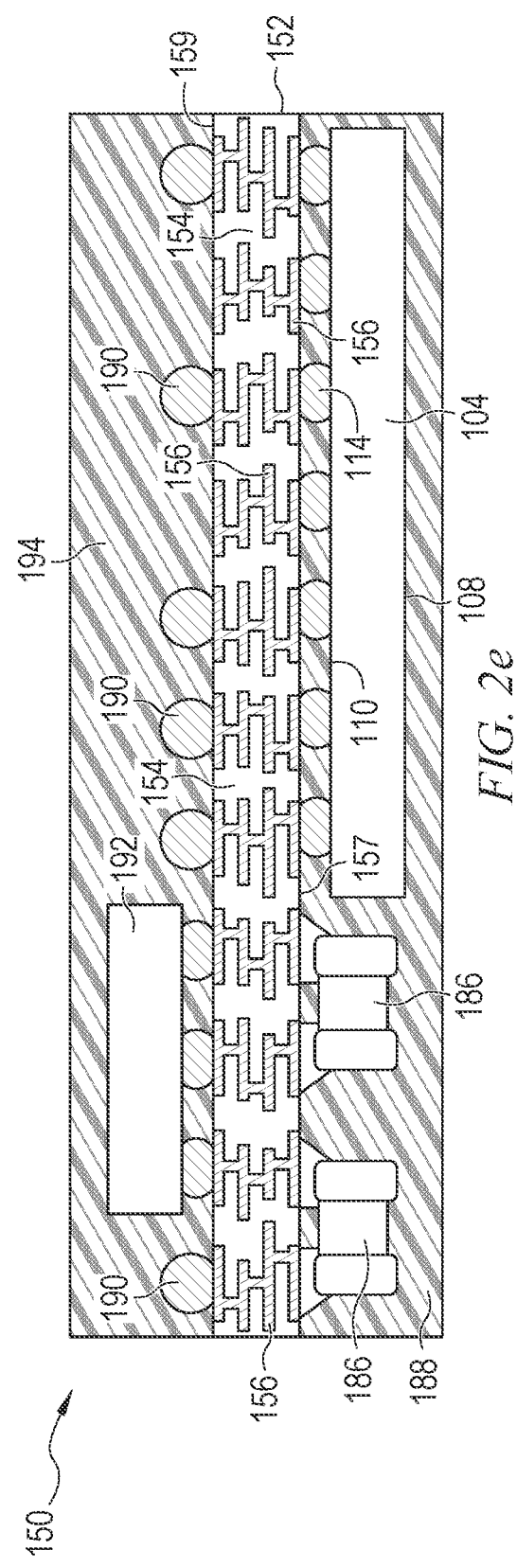
Figure 2F:
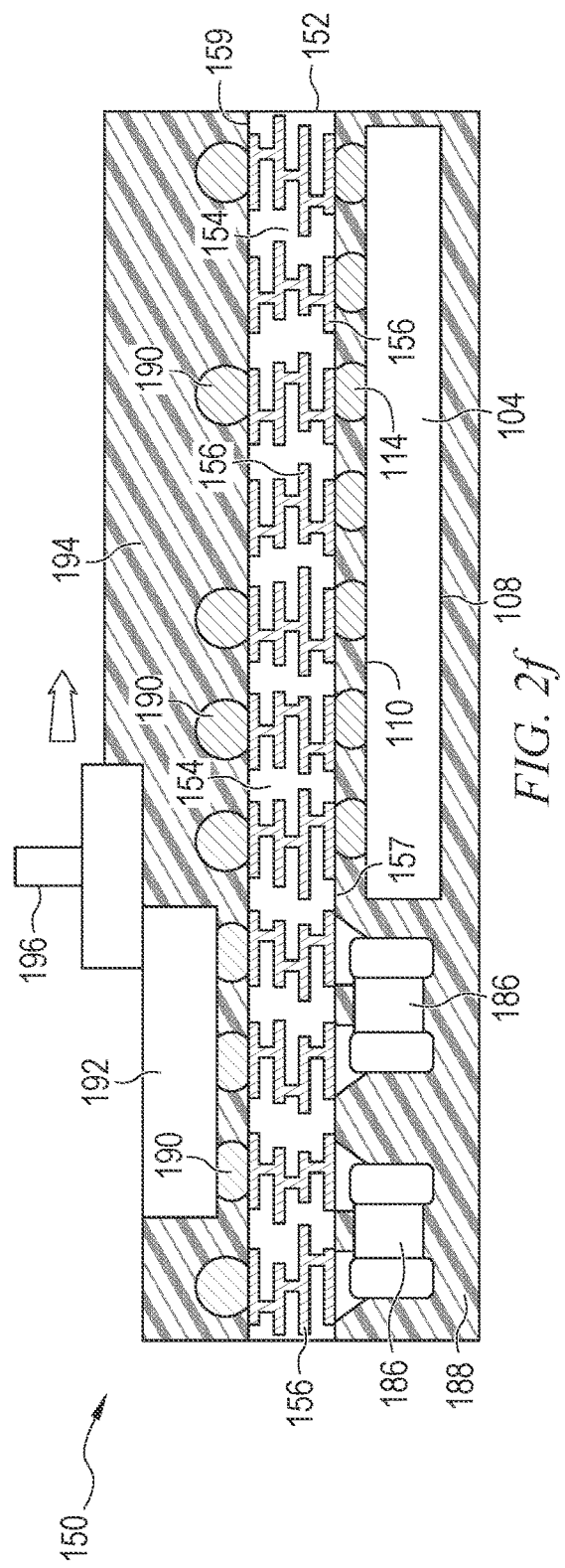

FIG. 2e shows encapsulant 194 deposited over bottom surface 159 in a similar molding process to encapsulant 188. Encapsulant 194 supports and protects semiconductor die 192 and any other components disposed on bottom surface 159. In FIG. 2f, encapsulant 194 is optionally backgrinded using chemical etching, mechanical grinding, chemical-mechanical planarization (CMP) using a grinder 196, or another suitable process. Grinder 196 removes encapsulant 194 over semiconductor die 192 to expose the back surface of the semiconductor die. Semiconductor die 192 is optionally backgrinded to reduce a height of the semiconductor die along with encapsulant 194. The backgrinding process results in a surface of encapsulant 194 being coplanar with a back surface of semiconductor die 192.

Figure 2G:
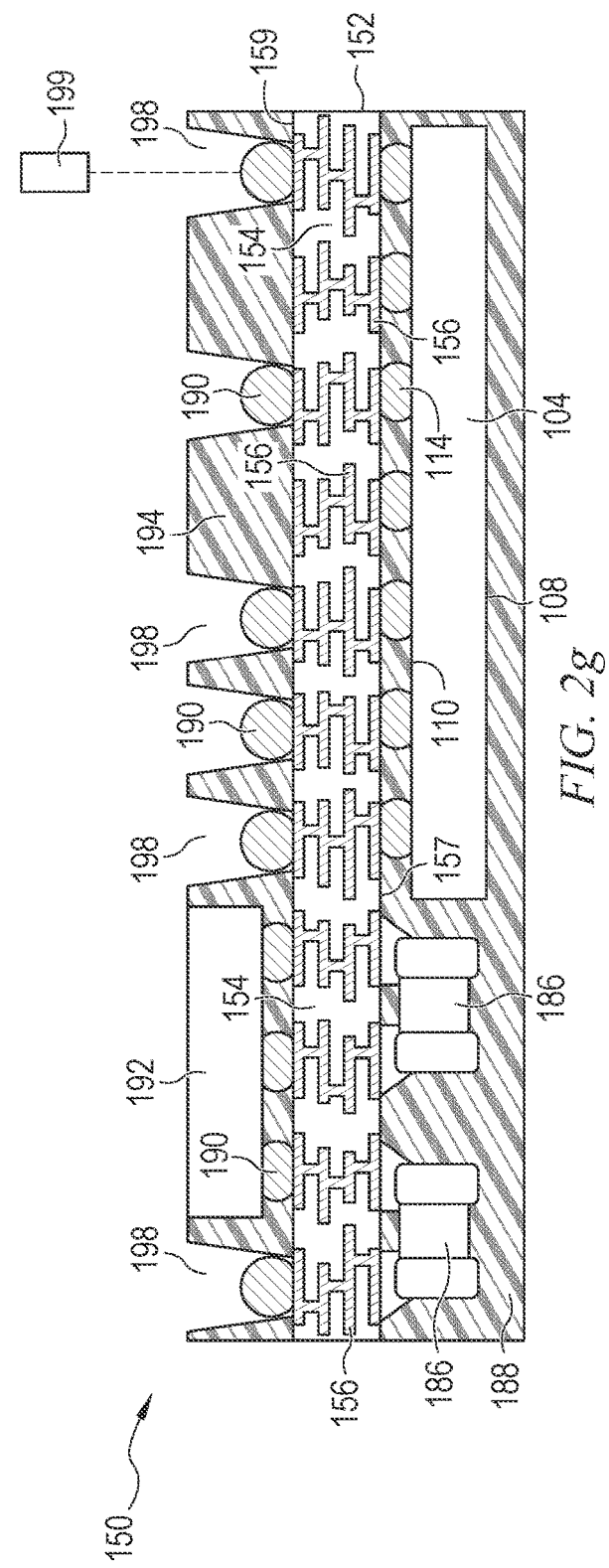

In FIG. 2g, openings 198 are formed into encapsulant 194 to expose conductive bumps 190. Openings 198 are formed using laser ablation with laser 199, mechanical drilling, chemical etching, or another suitable means. Additional solder is deposited into openings 198 in FIG. 2h and reflowed together with bumps 190 to form larger bumps 200 that extend over the external surface of encapsulant 194 to allow SiP module 150 to later be mounted onto a PCB or substrate of a larger electrical system.

In FIG. 2i, SiP module 150 is again flipped so that bumps 200 are oriented toward a carrier and encapsulant 188 is accessible for processing. A conductive material is sputtered over SiP module 150 to form a conductive shielding layer 210. Shielding layer 210 is formed using any suitable metal deposition technique, e.g., chemical vapor deposition, physical vapor deposition, other sputtering methods, spraying, or plating. The sputtered material can be copper, steel, aluminum, gold, combinations thereof, or any other suitable conductive material. In some embodiments, shielding layer 210 can be made by sputtering on multiple layers of differing material, e.g., stainless steel-copper-stainless steel or titanium-copper. Shielding layer 210 reduces electromagnetic interference (EMI) between the components of SiP module 150 and other nearby electronic devices. Shielding layer 210 is optionally grounded through conductive layers 156 to improve EMI reduction.

Figure 3A:
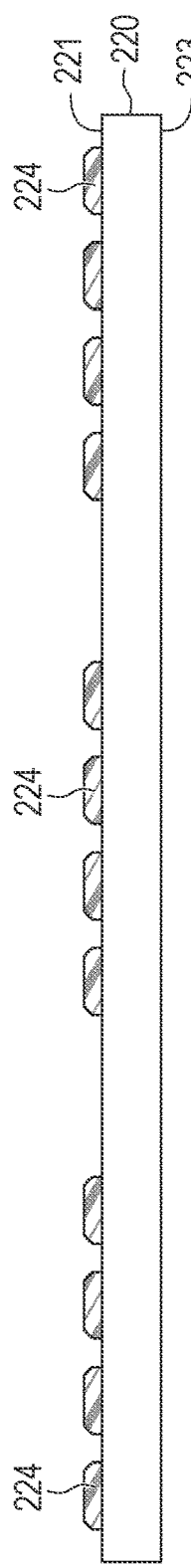
FIGS. 3a-3e illustrate forming an antenna PCB for use in an AiP device.

FIGS. 3a-3e illustrate a process of forming an antenna PCB usable with SiP module 150 to form an AiP device. FIG. 3a shows a partial cross-section of a panel 220 of antenna PCBs. Panel 220 has two major surfaces on opposite sides of the PCBs: bottom surface 221 and top surface 223. The antenna PCBs of panel 220 include conductive layers on and in the PCBs as necessary to form an antenna and interconnect the antenna to external devices. Typically, an antenna is formed for each unit either on or just within bottom surface 221. Contact pads for mounting SiP module 150 are formed on top surface 223. Conductive vias are formed through the antenna PCBs between top surface 223 and bottom surface 221 to electrically connect contact pads on top surface 223 to the antenna on bottom surface 221. Conductive pads, traces, vias, and any other suitable structure can be formed in or on panel 220 as needed.

Bumps 224 are formed on bottom surface 221. Bumps 224 are formed from an epoxy molding compound (EMC) or other polymer material. A material with a high dielectric constant is selected in some embodiments to reduce the impact on the underlying antenna. Bumps 224 are formed using a molding or printing process on panel 220. In other embodiments, bumps 224 are formed separately and then mounted to panel 220.

Figure 3B:
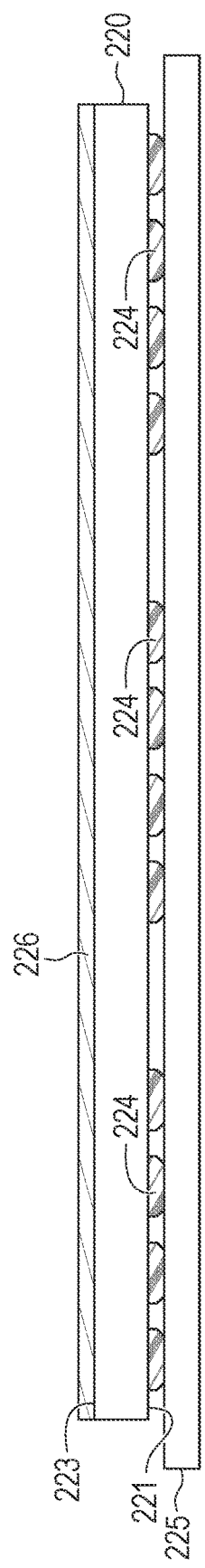
Figure 3C:
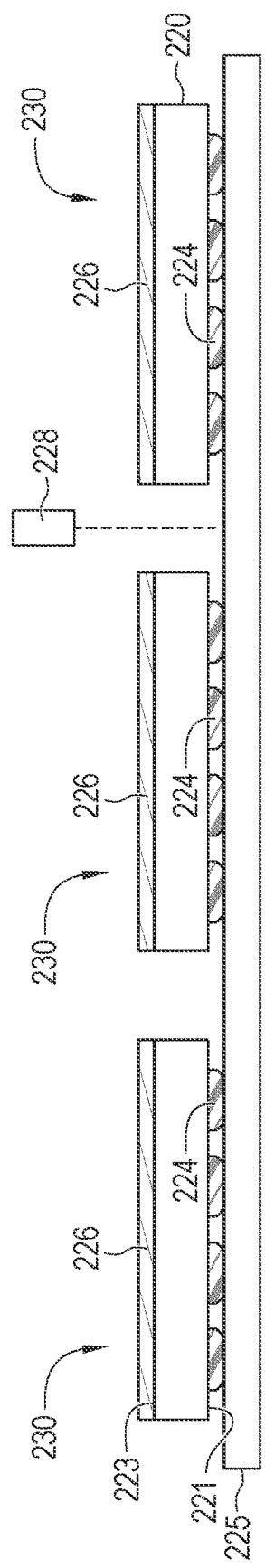
Figure 3D:
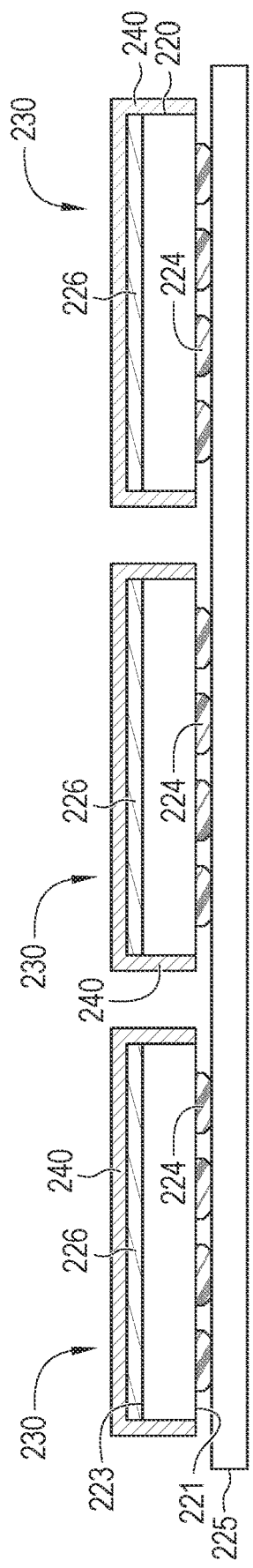

In FIG. 3b, panel 220 is flipped onto carrier 225 with top surface 223 oriented away from the carrier. A masking film or tape 226 is laminated onto panel 220. Panel 220 with masking tape 226 is singulated into individual antenna PCBs 230 using a laser cutting tool 228, water cutting tool, saw blade, or other suitable mechanism in FIG. 3c. In FIG. 3d, a shielding layer 240 is formed over antenna PCBs 230 by sputtering or another suitable method, e.g., those described above for shielding layer 210. Masking tape 226 is removed in FIG. 3e, along with the portions of shielding layer 240 on the masking tape, to leave antenna PCBs 230 with shielding layer 240 only on side surfaces of the antenna PCBs. Shielding layer 240 is optional. In some embodiments, panel 220 is singulated into antenna PCBs 220 immediately after applying bumps 224. The steps of FIGS. 3b, 3d, and 3e are not performed if shielding layer 240 is not desired.

Figure 3E:
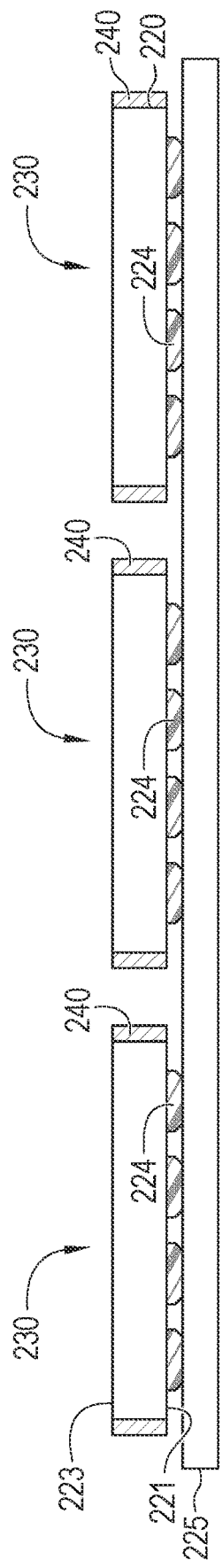
Figure 4:
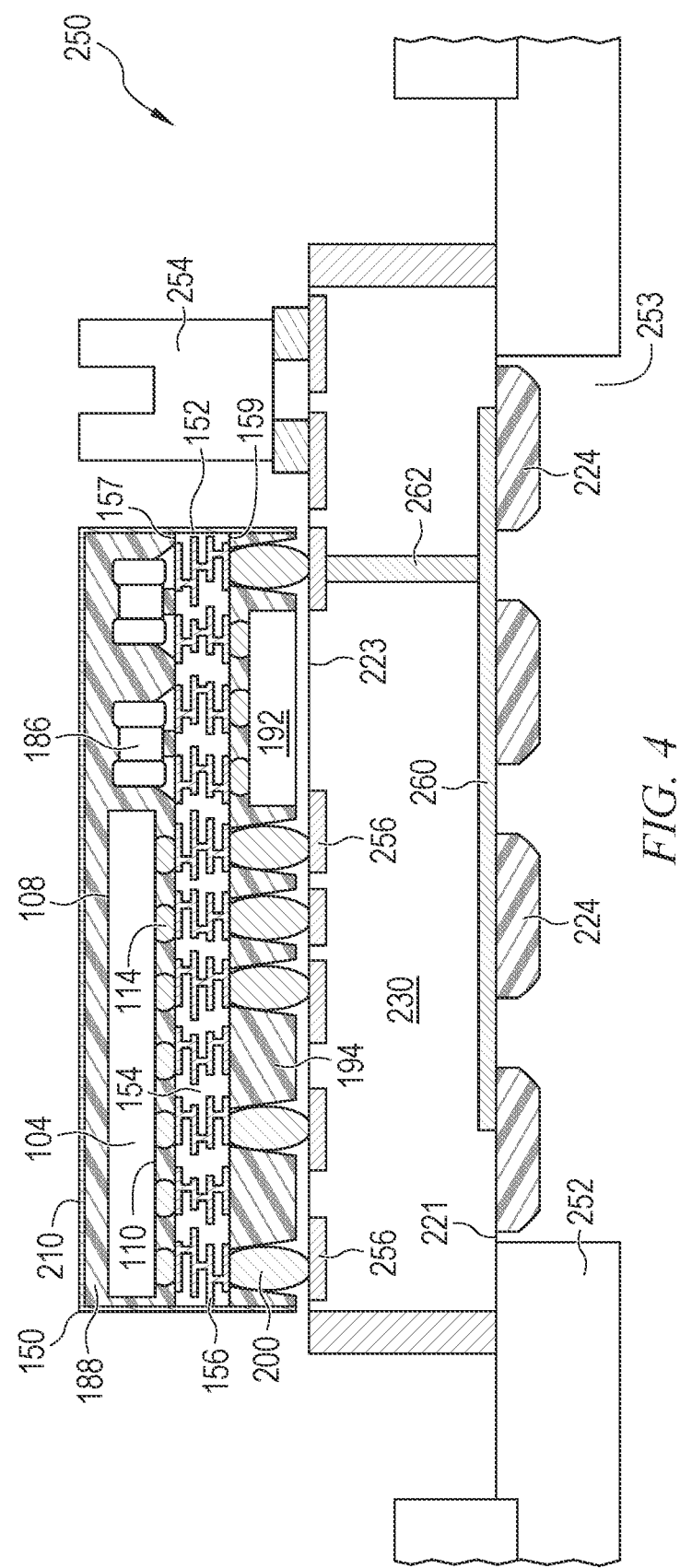
FIG. 4 illustrates combining the SiP module and antenna PCB into an AiP device.

Antenna PCBs 230 in FIG. 3e are completed and ready for integration into AiP devices. FIG. 4 illustrates an AiP device 250 with antenna PCB 230 and SiP module 150. To begin integration, an antenna PCB 230 is picked and placed off of carrier 225, from a tape-and-reel, or from another type of storage medium, and placed on a carrier 252. Carrier 252 includes an opening 253 for one or more AiP devices 250 being manufactured together. Opening 253 is wider than the combined footprints of bumps 224 so that all of the bumps fit within the opening while the perimeter of antenna PCB 230 rests on carrier 252 outside the opening. In other embodiments, AiP devices 250 are formed with antenna PCBs 230 remaining on carrier 225.

SiP module 150 and a board-to-board connector 254 are mounted onto top surface 223. Conductive layer 256 is illustrated formed on or under top surface 223 and includes contact pads for mounting of SiP module 150, B2B connector 254, and any other desired components. Solder bumps 200 are reflowed onto conductive layer 256 to mechanically and electrically couple SiP module 150 to antenna PCB 230. B2B connector 254 is used to attach a ribbon cable or another type of electrical conduit to AiP device 250 to allow other packages to communicate with, and utilize the functionality of, semiconductor die 104 and 192. SiP module 150 is connected to B2B connector 254 through conductive layer 256. SiP module 150 is one exemplary semiconductor package that can be mounted on antenna PCB 230. Any desired semiconductor package can be mounted onto antenna PCB 230 along with B2B connector 254.

Antenna 260 is illustrated as being formed by a conductive layer on or in bottom surface 221. Antenna 260 can be any suitable type of antenna, such as a microstrip antenna, planar inverted-F antenna, slotted waveguide antenna, near-field communication (NFC) antenna, fractal antenna, etc. In some embodiments, multiple and potentially different types of antennas are formed on a single antenna PCB 230. A conductive via 262 is formed through antenna PCB 230 to interconnect SiP module 150 to antenna 260. Semiconductor die 104, semiconductor die 192, or both are electrically connected to antenna 260 through conductive via 262, bumps 200, and substrate 152.

In one embodiment, antenna PCB 230 includes no other electrical components except for antenna 260 and a conductive path between SiP module 150 and the antenna. All system functions are performed by components within SiP module 150 and antenna PCB is only used to house an antenna to broadcast and receive electromagnetic radiation. SiP module 150 is disposed on antenna PCB 230 directly over antenna 260.

Antenna 260 is formed as part of an antenna PCB 230, separate from SiP module 150 that contains semiconductor die 104 and other system components. The separately formed and then stacked package components of AiP 250 make possible a higher interface pin count, reduced thickness of each separate structure, tight warpage control, and a higher level of integration. Manufacturing yield is improved due to the decrease in the number of laminated layers on a single system-plus-antenna substrate in the prior art. Reduced substrate thickness improves warpage characteristics. Even though antenna 260 is formed on a separate substrate, AiP 250 maintains the same or better performance, e.g., turn-around time characteristics, as structures used in the prior art.

Figure 5D:
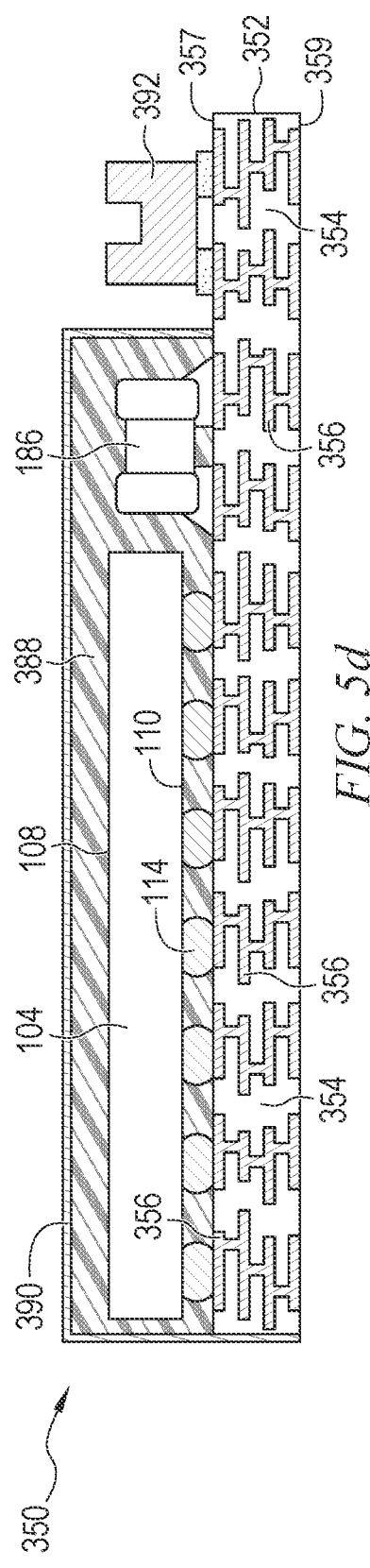

FIGS. 5a-5e illustrate an alternative SiP module embodiment. FIG. 5a shows SiP module 350 being formed on substrate 352 by disposing semiconductor die 104 and discrete components 186 on top surface 357, similar to formation of SiP module 150 above. Semiconductor die 192 may be disposed on top surface 357 in another cross-section, disposed on bottom surface 359 in a later step, or not used.

FIG. 5b shows encapsulant 388 deposited over substrate 352, semiconductor die 104, and discrete components 186. A portion of top surface 357 remains devoid of encapsulant 388 by using a mask or by etching or grinding away the encapsulant after deposition. A portion of conductive layer 356 remains exposed on top surface 357 outside the encapsulant for subsequent electrical interconnection.

In FIG. 5c, a shielding layer 390 is formed similarly to shielding layer 210 above. The portion of top surface 357 that remained exposed from encapsulant 388 also remains exposed from shielding layer 390 so that electrical components can be disposed thereon and electrically connected to conductive layer 356. A mask or lid is used during sputtering of shielding layer 390 to block formation of the shielding layer directly on substrate 352 where encapsulant 388 was not deposited. The mask or lid is removed to leave the portion of top surface 357 exposed.

Figure 5E:
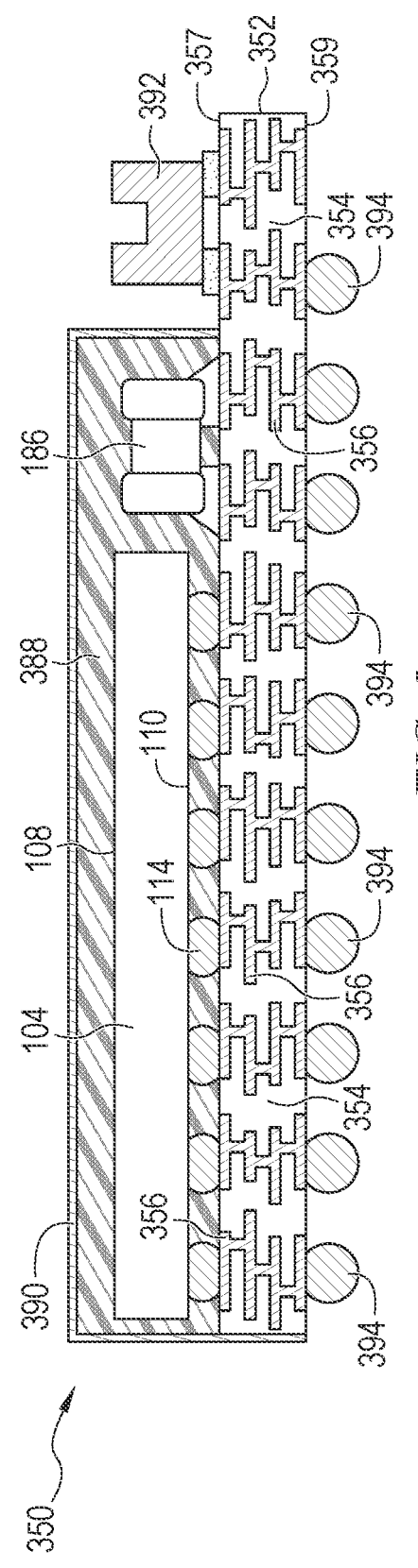
Figure 6:
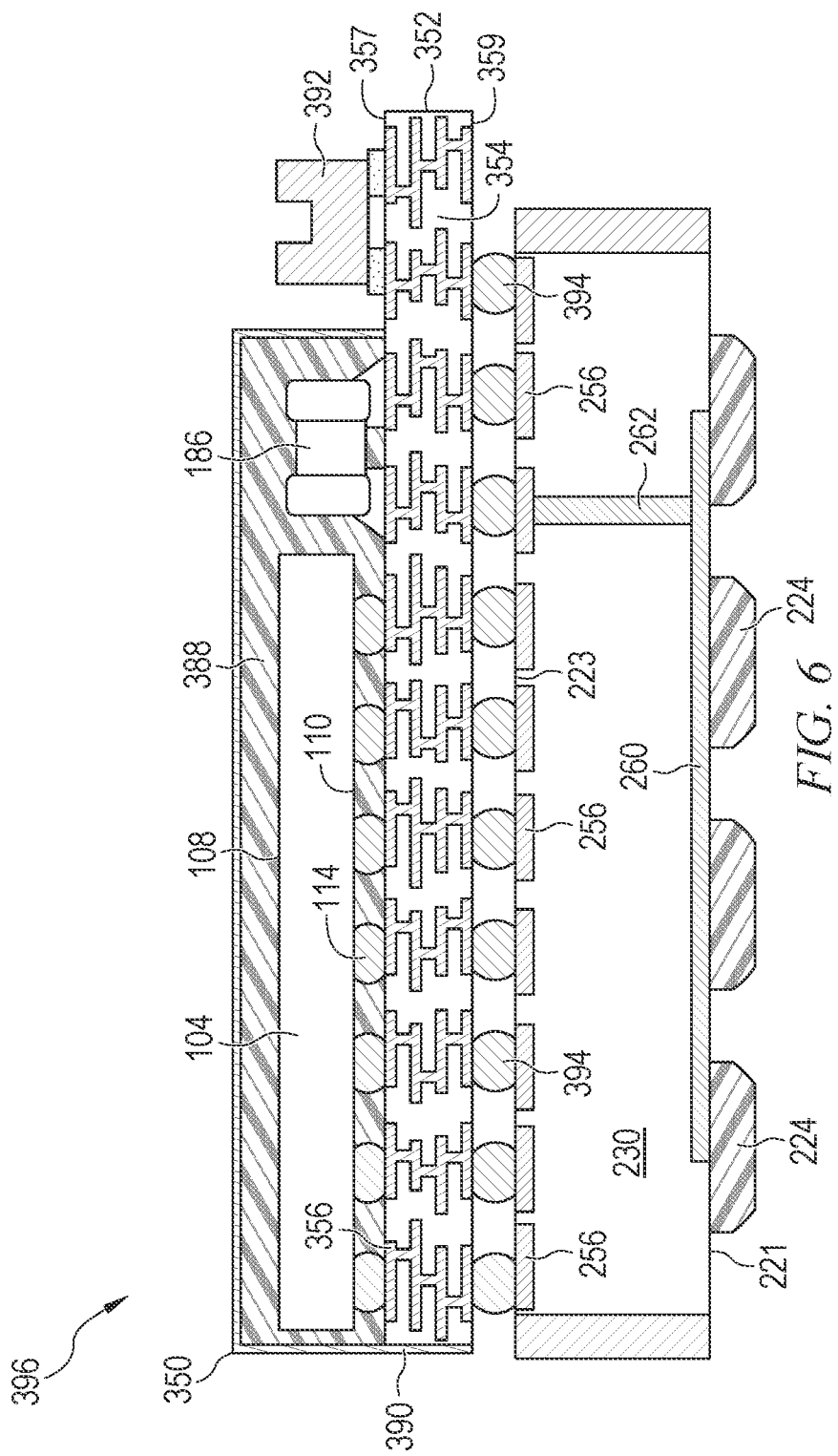
FIG. 6 illustrates an AiP device with the second SiP module embodiment.

B2B connector 392 is disposed on the exposed portion of substrate 352 in FIG. 5d. In FIG. 5e, bumps 394 are disposed on bottom surface 359 for later connection to an antenna PCB. FIG. 6 shows SiP module 350 mounted on antenna PCB 230 to form an AiP device 396. Similar to AiP device 250 above, semiconductor die 104 is coupled to antenna 260 through conductive via 262, conductive layer 256, bumps 394, conductive layer 356, and bumps 114. In some embodiments, one or more discrete components 186 are also coupled in series between semiconductor die 104 and antenna 260. AiP device 396 has all the benefits of AiP device 250. B2B connector 392 is disposed on substrate 352 instead of antenna PCB 230 in AiP device 250. SiP module 350 is only one example of a semiconductor package including a B2B connector that can be used with antenna PCB 230. Any suitable topology of semiconductor package can be used, including double-sided packages such as SiP module 150.

Figure 7:
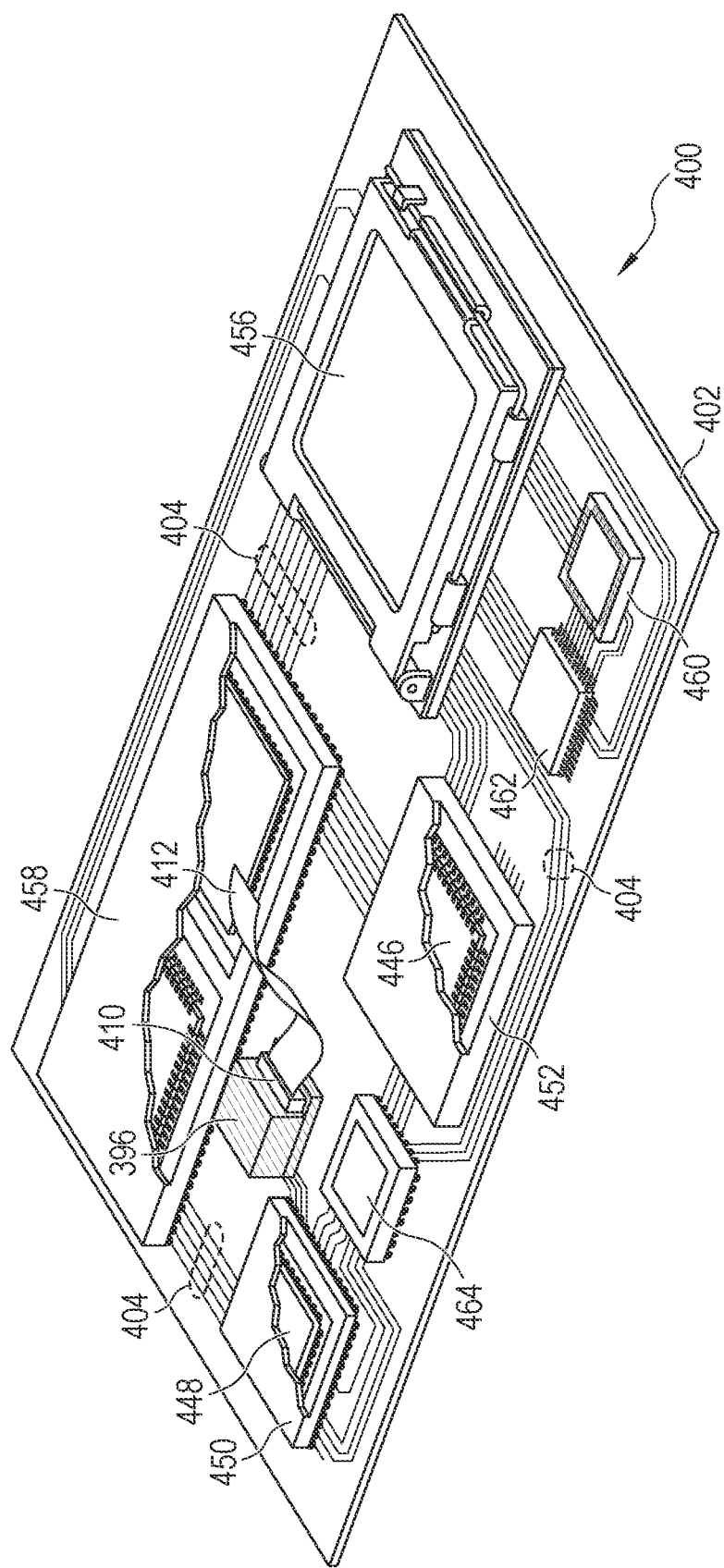
FIG. 7 illustrates integrating an AiP device into an electronic device.

FIG. 7 illustrates incorporating the above-described AiP devices, e.g., AiP device 396, into an electronic device 400. Electronic device 400 includes PCB 402 with a plurality of semiconductor packages mounted on a surface of the PCB, including AiP device 396. A ribbon cable 412 with connector 410 is plugged into B2B connector 392 to electrically couple another device to the components in AiP device 396. Connector 410 is configured to interface with B2B connector 392 so that ribbon cable 412 can conduct electrical signals to and from AiP device 396 through the ribbon cable. Ribbon cable 412 can be used to connect AiP device 396 to PCB 402, another package on PCB 402, another PCB of the same or different electronic device, another package on another PCB, another electronic device, testing equipment, etc. Other types of cable or conductor, such as coaxial cable or twisted-pair cables, can be used instead of a ribbon cable. Ribbon cable 412 is connected to semiconductor die 104 and discrete components 186 through substrate 152.

Electronic device 400 can have one type of semiconductor package, or multiple types of semiconductor packages, depending on the application. Electronic device 400 can be a stand-alone system that uses the semiconductor packages to perform one or more electrical functions. Alternatively, electronic device 400 can be a subcomponent of a larger system. For example, electronic device 400 can be part of a tablet computer, cellular phone, digital camera, communication system, or other electronic device. Electronic device 400 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 7, PCB 402 provides a general substrate for structural support and electrical interconnection of the semiconductor packages mounted on the PCB. Conductive signal traces 404 are formed over a surface or within layers of PCB 402 using evaporation, electrolytic plating, electroless plating, screen printing, or other suitable metal deposition process. Signal traces 404 provide for electrical communication between the semiconductor packages, mounted components, and other external systems or components. Traces 404 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 402. In other embodiments, a semiconductor device may only have the first level packaging where the die is mechanically and electrically mounted directly to PCB 402.

For the purpose of illustration, several types of first level packaging, including bond wire package 446 and flipchip 448, are shown on PCB 402. Additionally, several types of second level packaging, including ball grid array (BGA) 450, bump chip carrier (BCC) 452, land grid array (LGA) 456, multi-chip module (MCM) 458, quad flat non-leaded package (QFN) 460, quad flat package 462, and embedded wafer level ball grid array (eWLB) 464 are shown mounted on PCB 402 along with AiP device 396. Conductive traces 404 electrically couple the various packages and components disposed on PCB 402 to each other.

Depending upon the system requirements, any combination of semiconductor packages, configured with any combination of first and second level packaging styles, as well as other electronic components, can be connected to PCB 402. In some embodiments, electronic device 400 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
providing a PCB including an antenna formed on a first surface of the PCB;
providing a semiconductor package, including,
a substrate,
an encapsulant deposited over the substrate, and
a shielding layer completely covering a top surface of the encapsulant opposite the substrate and all side surfaces of the semiconductor package, wherein the shielding layer is connected to a ground node through a conductive layer of the substrate;
mounting the semiconductor package onto a second surface of the PCB opposite the first surface; and
disposing an epoxy molding compound (EMC) bump on the first surface of the PCB over the antenna, wherein the EMC bump is electrically insulating.

2. The method of claim 1, wherein the EMC bump is molded onto the PCB.

3. The method of claim 1, further including forming a second shielding layer over the PCB.

4. The method of claim 1, further including mounting a board-to-board (B2B) connector to the PCB.

5. The method of claim 1, wherein the semiconductor package includes a board-to-board (B2B) connector.

6. The method of claim 1, further including disposing a conductive bump between the semiconductor package and PCB.

7. A method of making a semiconductor device, comprising:
- providing an antenna PCB, wherein the antenna PCB includes a PCB and an antenna formed as part of a conductive layer directly on or in a first surface of the PCB;
- disposing a semiconductor package over a second surface of the antenna PCB opposite the first surface, wherein the semiconductor package includes,
  - a substrate,
  - a first semiconductor die mounted onto a first surface of the substrate,
  - a first encapsulant deposited over the first surface of the substrate with the first semiconductor die embedded in the first encapsulant,
  - a second semiconductor die mounted onto a second surface of the substrate,
  - a second encapsulant deposited over the second surface of the substrate with the second semiconductor die embedded in the second encapsulant,
  - a solder bump extending through the first encapsulant to the antenna PCB, and
  - a shielding layer completely covering a top surface of the first encapsulant opposite the substrate and all side surfaces of the semiconductor package, wherein the shielding layer is connected to a ground node through a conductive layer of the substrate; and
- forming a plurality of polymer bumps on the first surface of the antenna PCB, wherein the polymer bumps are electrically insulating.

8. The method of claim 7, further including:
- disposing a mask over the antenna PCB;
- forming a shielding layer over the antenna PCB and mask; and
- removing the mask.

9. The method of claim 7, further including disposing a board-to-board (B2B) connector over the antenna PCB, wherein the B2B connector is coupled to the semiconductor package through the antenna PCB.

10. The method of claim 7, wherein the semiconductor package includes a double-sided SiP module.

11. The method of claim 7, wherein the polymer bumps include a high dielectric constant.

12. The method of claim 7, further including disposing the solder bump between the antenna PCB and the substrate of the semiconductor package.

13. The method of claim 7, wherein the antenna PCB is devoid of electrical components except for the antenna and a conductive path to couple the antenna to the semiconductor package.

14. The method of claim 7, further including forming the plurality of polymer bumps directly on the antenna.

15. A semiconductor device, comprising:
- a PCB including an antenna;
- a semiconductor package mounted onto the PCB, wherein the semiconductor package includes,
  - a substrate,
  - a semiconductor die mounted onto a first surface of the substrate,
  - a first encapsulant deposited over the first surface of the substrate,
  - a solder bump extending through the encapsulant from the substrate to the PCB,
  - a second encapsulant deposited over a second surface of the substrate opposite the first surface, and
  - a shielding layer completely covering a top surface of the encapsulant opposite the substrate and all side surfaces of the semiconductor package, wherein the shielding layer is connected to a ground node through a conductive layer of the substrate; and
- a plurality of polymer bumps formed on a surface of the antenna PCB opposite the semiconductor package, wherein the polymer bumps are electrically insulating.

16. The semiconductor device of claim 15, further including a second shielding layer formed over the PCB.

17. The semiconductor device of claim 15, further including a board-to-board (B2B) connector mounted to the PCB.

18. The semiconductor device of claim 15, further including a board-to-board (B2B) connector disposed on the semiconductor package.

19. A semiconductor device, comprising:
- an antenna PCB including an antenna formed as part of a conductive layer directly on or in a first surface of the antenna PCB;
- a board-to-board (B2B) connector mounted onto the antenna PCB;
- a semiconductor package disposed over a second surface of the antenna PCB, wherein the B2B connector is coupled to the semiconductor package through the antenna PCB;
- a shielding layer completely covering a top surface and all side surfaces of the semiconductor package; and
- a polymer bump formed on the first surface of the antenna PCB directly over the antenna, wherein the polymer bump is electrically insulating.

20. The semiconductor device of claim 19, further including a shielding layer formed over the antenna PCB.

21. The semiconductor device of claim 19, further including a shielding layer formed over the semiconductor package.

22. The semiconductor device of claim 19, wherein the semiconductor package includes a double-sided SiP module.

23. The semiconductor device of claim 19, wherein the polymer bump includes a high dielectric constant.

* * * * *